United States Patent [19]

Hollander

[11] 4,114,099

[45] Sep. 12, 1978

[54] ULTRASONIC TELEVISION REMOTE CONTROL SYSTEM

[76] Inventor: Harry Hollander, P. O. Box 21, Braeside, Ontario, Canada

[21] Appl. No.: 751,181

[22] Filed: Dec. 16, 1976

[30] Foreign Application Priority Data

Apr. 1, 1976 [CA] Canada .................................. 249238

[51] Int. Cl.² .............................................. H04B 7/00
[52] U.S. Cl. ..................................... 325/392; 325/30; 340/171 PF
[58] Field of Search ......... 358/194; 340/16 C, 171 R, 340/171 PF; 325/30, 390, 391, 392; 334/8

[56] References Cited

U.S. PATENT DOCUMENTS 3,747,108  7/1973  Ringer ........................... 340/171 PF
3,823,385  7/1974  Kitamura ............................... 325/30

FOREIGN PATENT DOCUMENTS 2,275,094  9/1976  France ..................................... 358/194
2,351,289  4/1974  Fed. Rep. of Germany ........... 358/194

Primary Examiner—Robert L. Richardson
Attorney, Agent, or Firm—Charles A. Laff; J. Warren Whitesel; Howard B. Rockman

[57] ABSTRACT

A binary coded signal represented by sequential transmission of two frequencies, comprising means to determine if the frequency of the received signal is below or above a reference frequency generated within the receiver, means for recognizing a change in input frequency relative to the reference as start and end of bit intervals, means to establish if individual bits are of a "one" or "zero" level, means for converting the serial bits to a parallel digital word and means for storing this word indefinitely in the event the received data is a valid signal.

25 Claims, 9 Drawing Figures

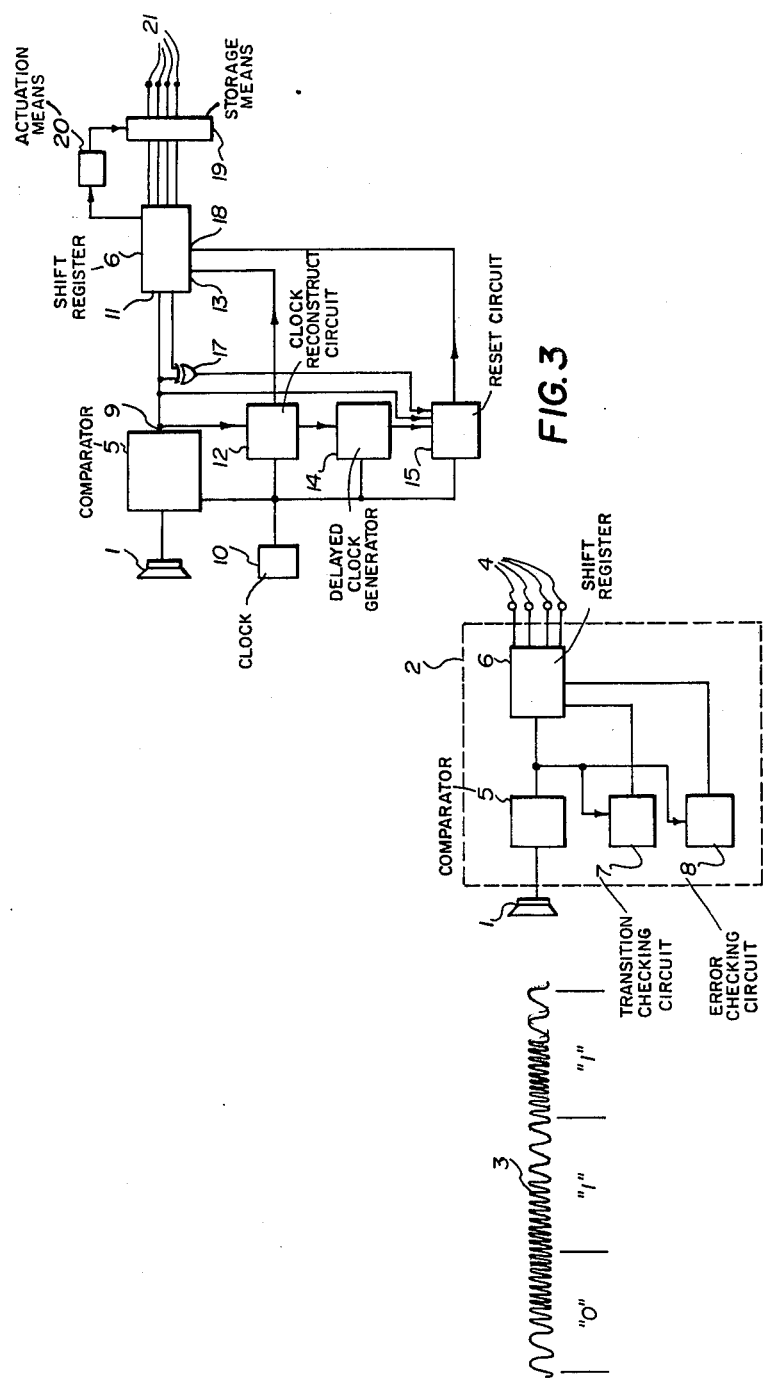

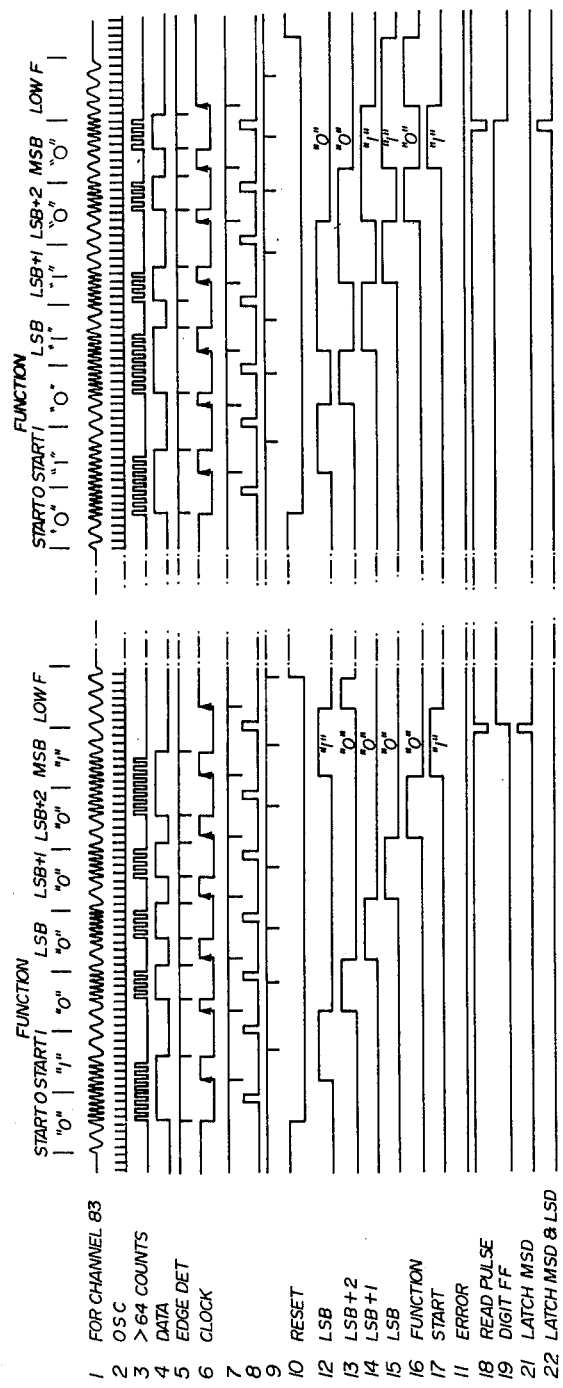

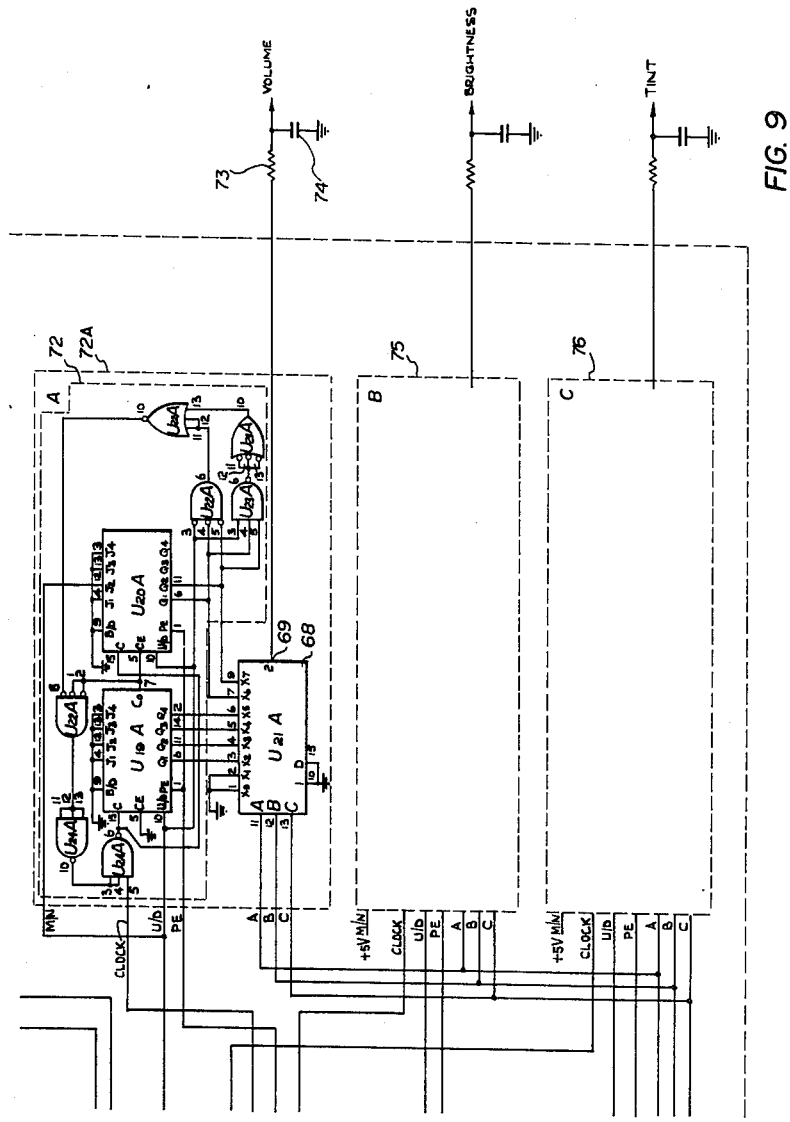

ULTRASONIC TELEVISION REMOTE CONTROL SYSTEM

This invention relates to a wireless remote control system which is particularly useful for the control of television receivers.

Where such apparatus as television receivers are to be controlled from a viewer location as to channel, volume, brightness, etc., the remote control systems usually are made up of a hand held transmitter which transmits an ultrasonic signal to a receiver connected to or built within the television receiver. The depression of buttons on the transmitter causes a variety of signals or signal frequencies to be transmitted, whereby channel change, volume change, etc. is responsively obtained.

However such systems have individually suffered from one or more problems, such as inability to have direct access to the desired channel, slow access, insufficient noise immunity making it often possible to operate the system with the jingling of a key chain or an ultrasonic sound originating from a dishwasher etc., unreliable control due to the absence of means to detect and suppress transmission errors resulting from echoes, interfering signal sources, etc. Also some control systems are not suitable for continuous analog commands such as volume, brightness, etc. Existing systems also often require the need for bandpass filters and accurate crystal oscillators which make them costly. Many systems are not very suitable for integration into custom integrated circuits.

The present invention provides a remote control system whereby the nature of the remote control signal allows utmost reliability of control. The remote control receiver will be found to be virtually immune to echoes and ambient ultrasonic noises, and therefore will not produce a false response in the presence of echoes and ultrasonic interfering signals. A variety of kinds of commands can be provided, and with the preferred embodiment disclosed, up to ninety-nine channels in a television receiver can be instantaneously selected, without the requirement for sequentially stepping through each channel. Volume can be varied or muted, tint or brightness controlled, etc.

The above advantages are obtained by the transmission of a unique type of two tone coded signal which advantageously contains information defining start-up transmitted data, type of command (i.e. channel select identification or miscellaneous command such as volume), information permitting reconstruction of clock and identification of end of data. The two tones are transmitted sequentially. The second tone is transmitted to provide masking of echoes produced by the first tone and to mask noises that may be present in the operating environment of the system.

Since the two tones may be close together in frequency, it is possible to operate the remote control system in conjunction with high sensitivity resonant type microphones, thereby achieving high sensitivity together with high noise immunity. This also eliminates the need for input bandpass amplifiers.

The inventive receiver is thus rendered immune from operation by extraneous noise further by the provision of received data error checking circuitry for the timing of input pulses, etc., and for rejecting the data if an error is detected. The receiver also has provision for operation of continuous analog circuits in a television set, such as brightness, volume and tint controls, etc. Since echoes are masked out in the present system, data transmission can occur much more rapidly than in prior systems, as the receiver does not have to wait until echoes die out between transmission of bits for identification of data pulses.

Since all that is frequency dependent is the detection of signal above or below a predetermined reference frequency, accurate crystals for timing and reference frequency generation are not needed. The receiver is virtually entirely digital logic, making it suitable for monolithic integration with a minimum of external components. CMOS integrated circuit logic is preferred, minimizing power supply requirements.

In the preferred embodiment, two digits are transmitted separately and the second must be received within a given time interval, or the first number is disregarded. This method eliminates the need for a clear key as normally present on calculators.

The output of the receiver is a binary or BCD signal which can be used by known means to control the frequency of a selected channel, or to perform other functions such as variation of volume, control of brightness, tint, etc. in a television set.

It should also be understood that the use of this invention is not intended to be restricted to a television set, but can be utilized for the control of a large variety of other kinds of apparatus, e.g. door locks, household appliances, radio receivers, production machinery, etc. While the description below will be directed to a wireless ultrasonic transmitter-receiver system, it should be understood that a wired system, a radio control system, etc. could be used in the alternative.

The advantages of the invention are obtained by the provision of a system including means for receiving a transmitted signal comprising a pulse envelope modulated continuous wave ultrasonic signal at a first predetermined frequency, each pulse being immediately followed by a continuous wave ultrasonic signal at a second predetermined frequency which has amplitude such as to mask echoes of the first predetermined frequency at the receiving means, the pulses being representative of a sequence of binary bits, means to determine whether the received signal is above or below the frequency of a reference frequency, means for recognizing a change in input frequency with respect to the reference frequency, and means for counting said changes, determining the value of the binary bits, and providing a parallel coded signal representative of said value.

A better understanding of the invention will be obtained by reference to the following drawings, in which:

FIG. 2 is a block diagram of the receiver of the invention in its broadest aspect;

FIG. 3 is a more detailed block diagram of the invention;

FIG. 4 is a timing diagram of signals encountered at various locations of the circuit;

FIG. 5 shows how FIGS. 6, 7, 8 and 9 are to be placed together; and

Figure 6:
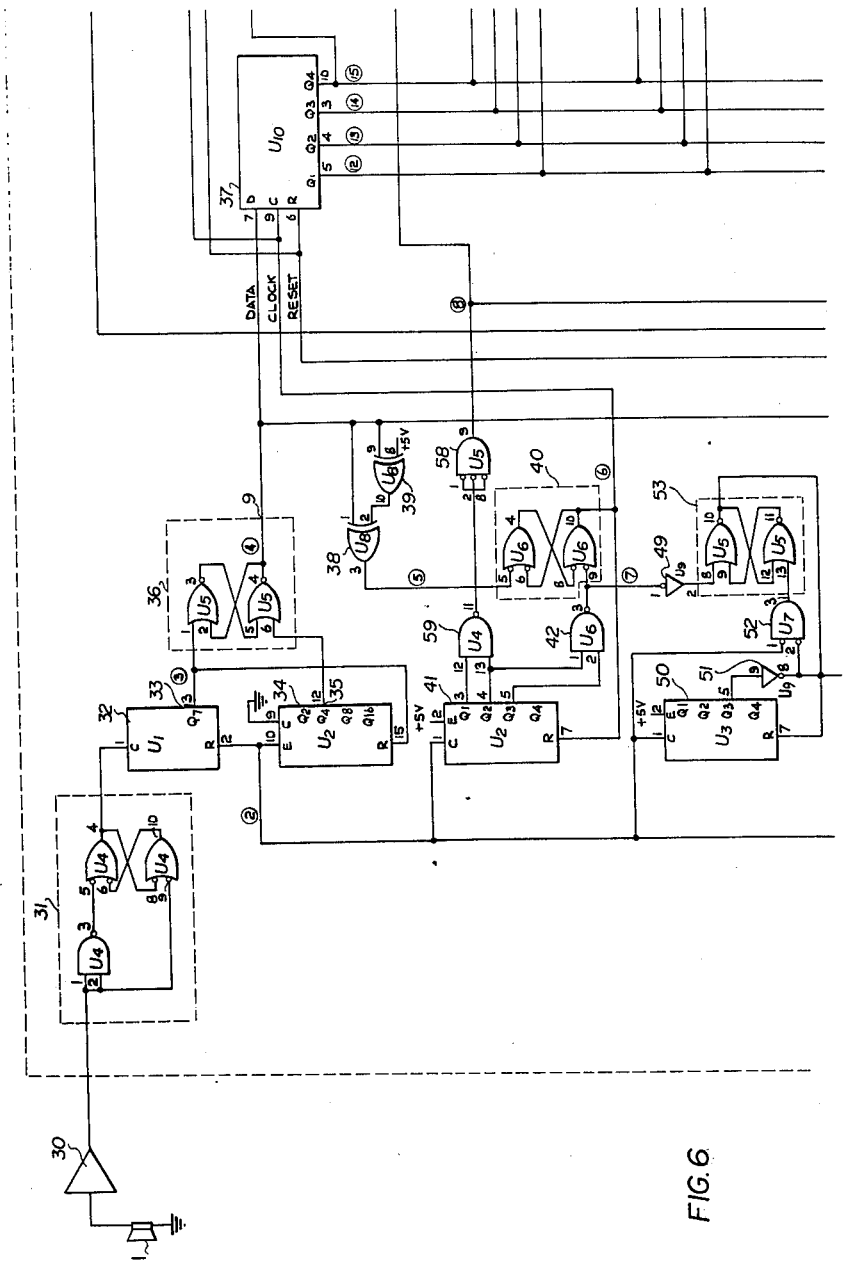
Figure 7:
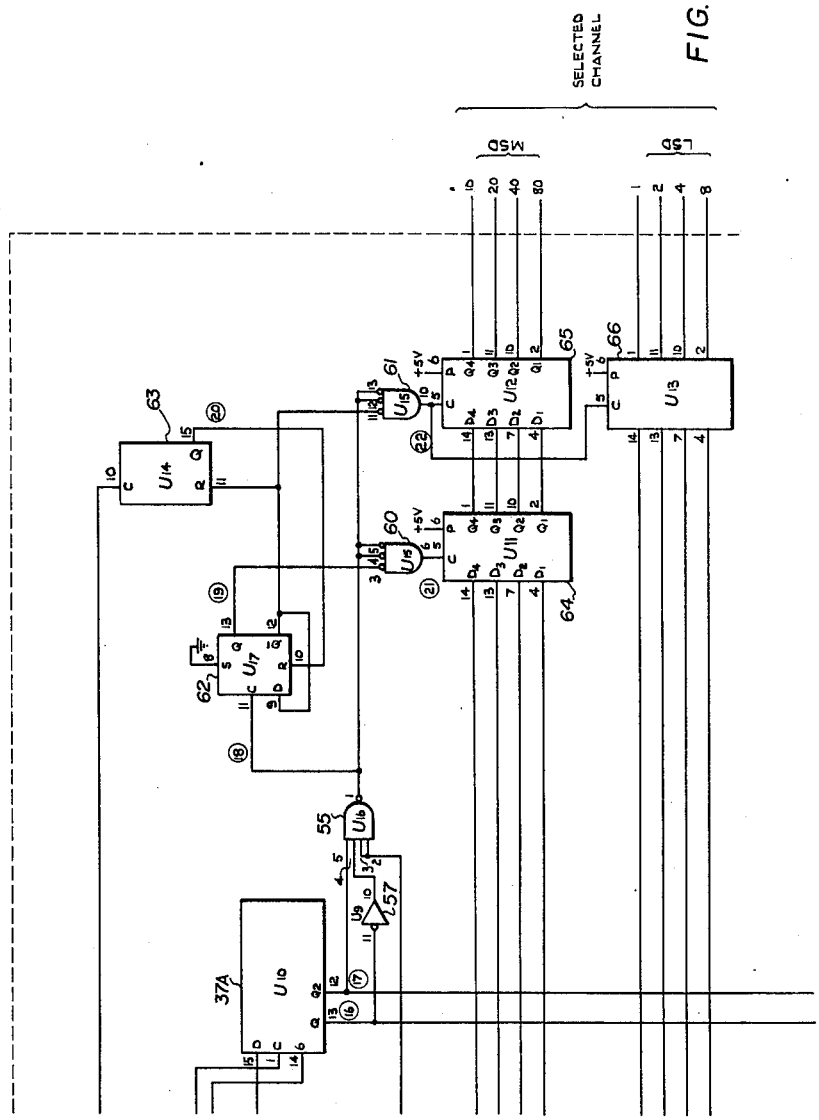
Figure 8:
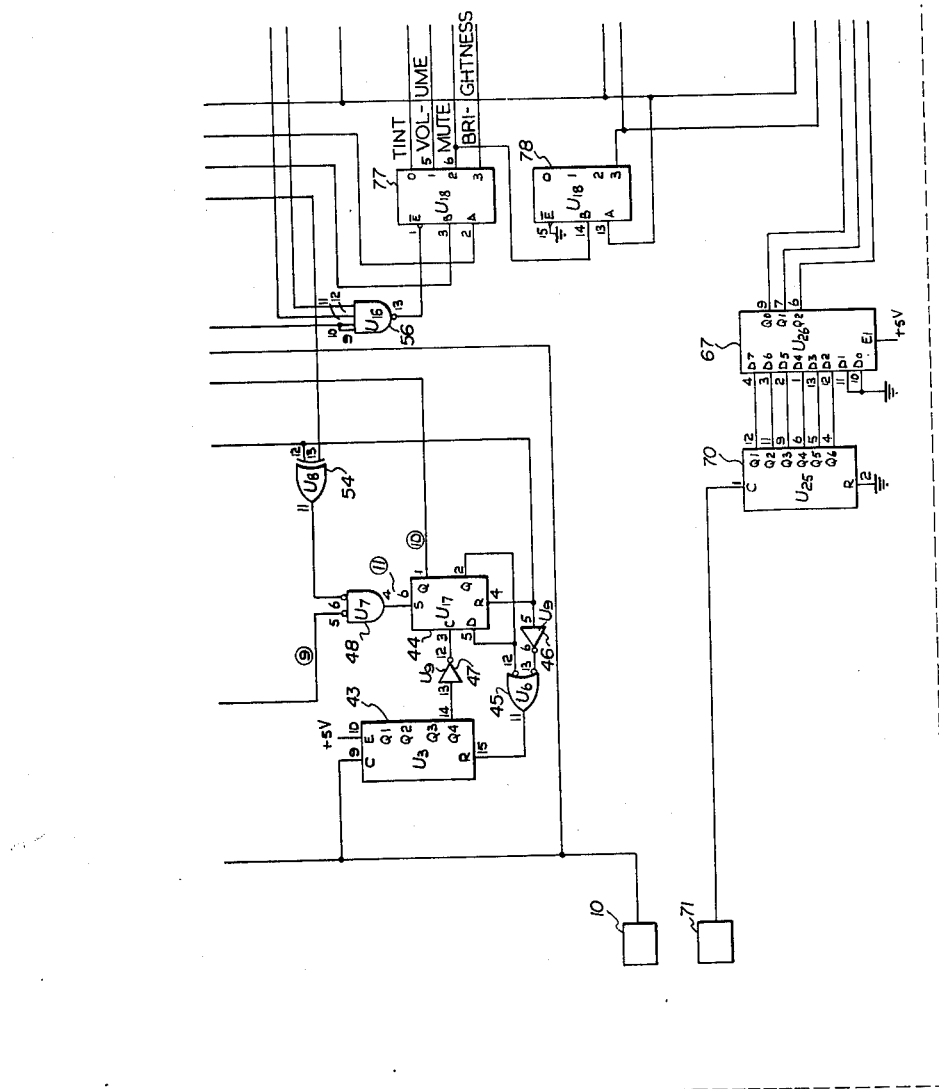

FIGS. 6, 7, 8 and 9, placed together as shown in FIG. 6, show a detailed schematic of the receiver portion of the invention.

Figure 1:
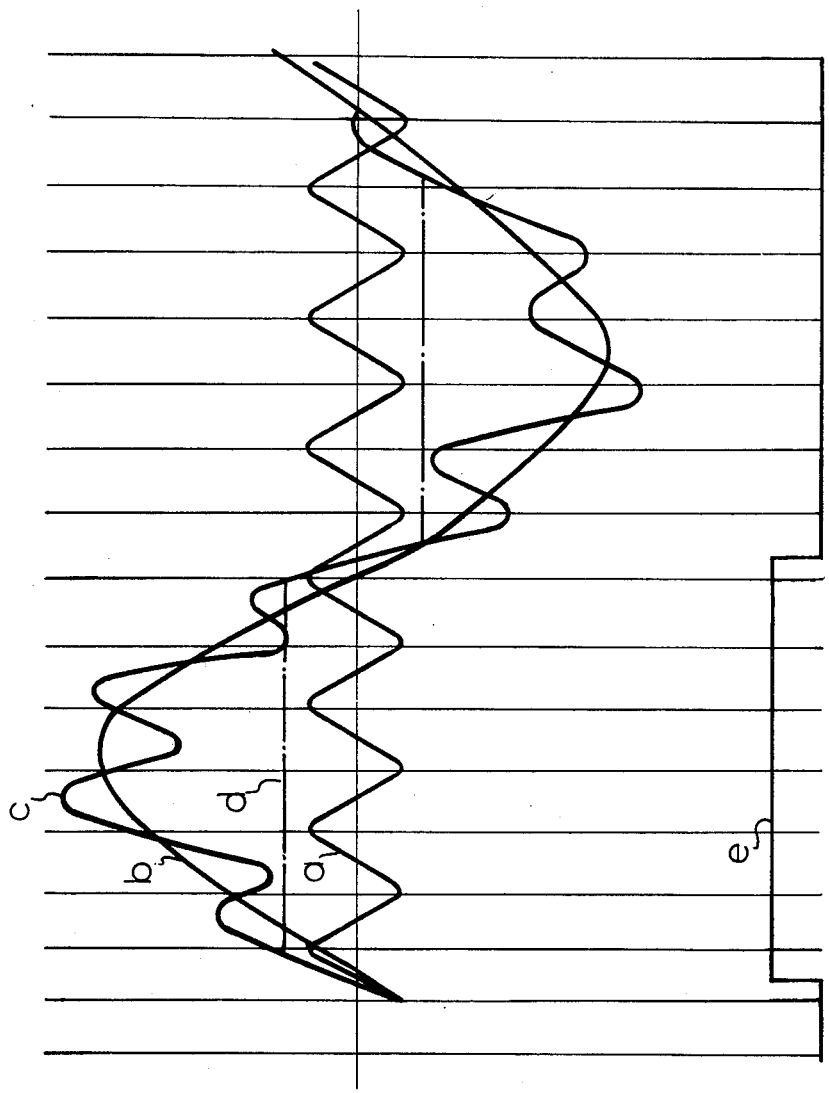
FIG. 1 is a waveform diagram illustrating the masking effect of a second frequency being transmitted while an echo of the first frequency is present.

FIG. 1 illustrates how the transmitted second frequency affects the influence of an echo of the first frequency transmitted earlier. In this figure, curve *a* represents the echo signal, curve b represents a second frequency transmitted while the echo is present. Curve c is the resulting signal the receiver microphone will receive. This signal is effectively amplified and clipped in the receiver at levels depending on signal strength and amplifier saturation levels to a waveform which looks more or less like curve d. After passing this signal through a Schmitt trigger a signal as shown in e will operate the receiver. As can be seen the signal in curve e which the remote controlled receiver has to work with does not contain the high frequency components of the echo shown in curve a. Thus, the number of zero crossings for a time interval is reduced to an extent determined by the relative level of the second frequency transmitted while an echo of the first frequency is present. The effects of noise are reduced in a similar manner.

Turning next to FIG. 2, an ultrasonic transducer 1 is shown connected to a receiving means 2. In front of the ultrasonic transducer is waveform 3 of a signal received from a transmitter. The signal is representative of a series of time intervals. During each interval one of two frequencies is transmitted. In the particular system described here two intervals are used for transmission of each bit where a "zero" is represented by an interval containing the lower of the two frequencies followed by an interval containing the higher of the two frequencies and a "one" is represented by an interval containing the higher of the two frequencies followed by an interval containing the lower of the two frequencies.

The same transmitted signal may however be considered as consisting of a series of bits where each bit is followed by a complemented bit. In this case the lower frequency interval used for a true "zero" bit and a complemented "one" bit and the higher frequency interval is used for a true "one" bit and a complemented "zero" bit. An examination of waveform 3 will show the presence of three bits, demarcated by the vertical lines which depict three successive time intervals. The last two of the bits are identical, and the first is of the opposite type.

The receiving means 2 is comprised of means for determining the binary digit represented by each of the serial pair of frequencies, and for providing an address signal representative of the value of the series of binary digits received, at an address output 4.

It will be realized that the receiving means decodes the frequency intervals and provides data pulses representative thereof which are then decoded and translated to an address. The data pulses are translated, depending on their position in time, from serial to parallel data.

The ultrasonic transducer 1 translates the ultrasonic signal into an electrical signal which is fed to a frequency comparator 5, which provides a high level data signal if the frequency of the signal portion checked equals or exceeds a reference frequency. The data pulse is applied to a shift register 6 which converts the serial data signal and provides an address signal at the address output 4.

However, also connected to the output of the frequency comparator 5 and to the shift register 6 is means for checking transition from a low to high frequency interval or high to low frequency interval 7 and for generating a clock pulse for subsequent application to the shift register to permit serial to parallel conversion. An error checking means 8 is also conneted to the comparator 5 and to the shift register 6, which checks for errors in the data pulse train, and inhibits operation of the shift register if the data received contains an error.

Turning now to FIG. 3, the inventive receiver is shown in more detailed block diagram form. Ultrasonic transducer 1 is connected to a frequency comparator 5. As noted earlier, the output of frequency comparator 5 is a series of square-wave pulses, constituting the data, at output 9.

Connected to the frequency comparator 5 is a clock 10, having a square wave output frequency which is an integral divisor of a frequency which is between the lower and higher received frequencies. The frequency comparator includes a latching circuit at its output and is designed to cause the data output of the comparator to be high for the period of the higher frequency signal of each bit received. The data signal is applied from the output of the frequency comparator to the data input 11 of shift register 6.

In order to shift the data through shift register 6, a clock signal is required. In this connection the required clock signal is constructed from the data and is located in time so as to occur during determined time periods. The determined periods are located so as to identify the times in the data pulse train which are to be counted as the binary representation of a signal.

The data pulses are applied to a clock reconstruct circuit 12, which obtains the leading and trailing edges of the pulses. Clock pulses from the reference clock 10 are also applied to the clock construct circuit. A predetermined number of pulses from the time reference clock 10 are counted starting at the first leading edge of the first data pulse. A predetermined number of counts later, a constructed clock pulse is initiated. At the next (trailing) edge of the data pulse, the constructed clock pulse stopped, and the time reference clock pulse counting circuit within the clock reconstruct circuit 12 is reset. Again, after a predetermined number of pulses from reference clock circuit 10, a constructed clock pulse is initiated, and terminated with the next leading edge of the next pulse. Fabrication of clock pulses will continue during the receipt of data pulses. The constructed clock pulses are applied to clock input 13 of shift register 6.

It may be seen that clock pulses will be constructed in the clock construct circuit 12 only as long as data is applied to it from output 9 of the frequency comparator 5. Consequently data will only be read into shift register 6 as long as actual data pulses are received. Because the constructed clock pulses are obtained as a result of the receipt of the data pulses, and the constructed clock pulses are located at a position in time corresponding to the actual digital value of the data pulses, the shift register will be caused to shift data at the proper times.

As will be described later in detail, in the preferred embodiment there are approximately eight time reference pulses during a bit period. The constructed clock signal is shifted from the first data leading edge by a count of six of the time reference pulses, in order to properly locate them. In order to check whether an error has crept into the data signal, an error checking means is provided (element 8 in FIG. 2) comprising a delayed clock generator 14, and a reset circuit 15.

The delayed clock generator 14 receives a signal comprising every clock 13 pulse from clock construct circuit 12, and is also connected to the time reference clock source 10. In the delayed clock generator, a pulse is generated at approximately half a bit period (i.e. four time reference clock pulses) after clock 13. This half bit delayed clock is applied to reset circuit 15. The purpose of the delay is to check whether data being outputted at output 9 of the frequency comparator during a period one-half half data bit later, and the data just shifted in the shift register are equal. If this occurs, it will be understood that the low frequency - high frequency or vice versa sequence of the received data pulses is erroneous, e.g. resulting from false data inputs and/or excessive distance of the transmitter from the receiver, etc. Output data from comparator 5 is applied to an exclusive OR gate 17 along with a representation of the data in the first shifted location in the shift register 6, the output of exclusive OR gate 17 is applied to reset circuit 15.

The output of reset circuit 15 is connected to reset input 18 of shift register 6. Reset circuit 15 is also connected to time reference clock 10.

In operation, reset circuit 15 starts counting time reference clock pulses following a high to low transition in the data signal and provides a reset signal to shift register 6 after 10 time reference pulses. Since the interval during which the data is "zero" is, in the preferred embodiment, maximum eight time reference pulses long, exceeding eight pulses (as by a count of ten in the clock counter of the reset circuit), will establish whether the next data bit is missing, e.g. due to a transmission error or after completion of transmission. If, at the time of the constructed clock pulse the next data bit is not missing, the reset counter is itself reset, and a low output is maintained to reset input 18 of shift register 6 from the reset circuit 15 which permits shifting of data. In the event that a data pulse is found to be missing, the reset circuit 15 applies a reset pulse to the shift register, eliminating the data count resident therein now determined to be erroneous, thus recycling it in preparation for receipt of a new data signal.

Once all data has been entered in the shift register 6, it is applied to a storage means 19. An actuation means 20 provides a clocking signal to storage means 19 to provide an output address signal at output terminals 21.

The address will normally consist of the equivalent of two decimal digits. Upon a reading in of both digits into shift register 6, the actuation means 20 will be caused to operate, and the two digit parallel output signal provided at the output terminals 21.

It will be understood, of course, that the output terminals can be conveniently divided into two groups, whereupon two parallel BCD numbers will be provided. The actuation means therefore can be comprised of a flip flop which directs the data signal from the output of the shift register be outputted to the respective two portions of the storage means 19 at the proper time.

A description of the preferred embodiment of the receiver will follow, with reference to FIG. 4, a waveform diagram and FIGS. 6, 7, 8 and 9 assembled as shown in FIG. 5. The circled numerals on the schematic diagram refer to the waveform numbers in FIG. 4.

As shown in waveform 1 in FIG. 4, the input signal to the receiver is comprised of a series of low and high frequency signals. It is preferred that a binary "zero" be represented by a low frequency followed by a high frequency series of cycles, and a "one" by a high frequency followed by a low frequency series of cycles. The binary designation, of course, can be reversed if preferred, assuming the circuit is designed to interpret the numeral correctly.

To operate the receiver, it is preferred that each decimal digit be represented by seven binary digits, followed by a period of low frequency signal. The binary digits, in sequence, can be as follows (as shown above waveform 1): a "zero" bit followed by a "one" bit to designate the start of a bit sequence. The next bit is a function designation bit, followed by a series of four address bits designating serially the least significant bit LSB increasing in rank to the most significant bit MSB. A period of low frequency signal ends the series, to mask any echoes which may be received following the completion of data transmission, and to allow the reset circuit 15 to clear shift register 6 after all data has been entered into shift register 6.

The function bit and numerical series is shown, for example, as a zero, zero, zero, zero and one. The function bit, in this example, shows a "zero" for the designation of the transmission of digits of a chanel number, while the following bits designate one digit of the channel number. A "one" for the function bit designates an analog or on/off command, the following bits being directed to other than channel selection, such as for adjustment of volume, brightness, tint, etc. The bits following the function bit designate what function is to be varied to a predetermined degree. Two sequences of BCD numbers are received to fully identify the channel number in the case of a 100 channel system and repetitive transmission of a function "one" and a following number varies the selected function repetitively for the duration of transmission.

In the embodiment to be described below, the two frequencies making up the ultrasonic signal transmitted from the transmitter were 38.5 kilohertz and 41.5 kilohertz.

The signal is received at ultrasonic transducer 1 of a well known type, but preferably a high sensitivity resonant type microphone. The received signal is then amplified in an amplifier 30 as required and then applied to Schmitt trigger 31. The Schmitt trigger is of well known construction, and consequently will not be described further. Its function is to change the input signal into a clean square wave pulse form. The output of the Schmitt trigger is applied to a counter 32.

The counter 32 provides an output at its seventh binary position output port; the seventh position will result in an output pulse at port 33 upon a count of 64 input pulses being received.

Receiver clock 10 is connected to the reset input R of counter 32; its frequency is 625 Hertz. Since the high frequency input signal is higher than 40 kiloHertz, each 64th pulse (cycle) occurs at shorter intervals than 1/625ths successive of a second. Every 1/625ths of a second a short duration time reference pulse from clock 10 appears at the reset input of counter 32, resetting it to begin again counting input frequency cycles. Since the lower frequency, of less than 40 Kilohertz, has each successive input pulse occurring at a longer time interval than 1/625ths of a second, the reset pulse will reset the counter to its starting position before the count can reach 64. Consequently for frequencies lower than 40 Kilohertz, no output pulse will be provided from counter 32.

A series of output pulses, corresponding to presence of the high frequency portion of the input signal, are thus provided at output port 33 every 1/625ths of a second.

The pulse at output port 33 from counter 32 provides a set signal to data latch 36 and a reset signal from counter 34.

Counter 34 starts counting time reference clock pulses 10 after the signal 33 at its reset input is returned to "zero". The output port 35 of counter 34 will however reset every 1/625ths of a second (⅛ bit interval) as long as a high frequency (greater than 40 Kilohertz) input signal is present at the clock input of counter 32. If the input frequency to counter 32 is a low frequency signal (less than 40 Kilohertz) counter 34 is allowed to count time reference clock 10 pulses resulting in output 35 of the second stage in the counter to go high after approximately 1/625th second.

Signal 35 is fed to the reset input of data latch 36. The output 9 of the data latch is therefore a signal resembling the transmitted data but which is synchronized to the time reference clock and with the lower frequency signal portion replaced by a low level and the higher frequency signal portion in the received signal replaced by a high level signal.

The output signal of the time reference clock 10 is shown on line 2 of FIG. 4, the output of the signal at output port 33 is shown at line 3 and the output of the latch circuit 36 is shown at line 4.

The data signal is applied to the data input port D of shift register 37, which is coupled in a well known manner to shift register 37a to provide for registration of an excess number of digits than the four that shift register 37 can handle.

The clock construct circuit will now be described. An exclusive OR gate 38 and another inverter connected exclusive OR gate 39 are connected as an edge detector to the output 9 of the data latch circuit 36. One of the inputs of exclusive OR gate 38 is connected to output 9, and the inverted and slightly delayed output of exclusive OR gate 39 is connected to the second input of exclusive OR gate 38. At the output of exclusive OR gate 38 the leading and trailing edges of the data pulses result as short interval pulses. These are applied to one of the two inputs of latch circuit 40.

Also connected to the time reference clock 10 is a counter 41, which is adapted to provide an output after a count of six clock pulses. The counter 41 has its "two" and "four" binary digit outputs connected to respective inputs of AND gate 42, which has its output connected to the second of the two inputs to latch 40. The output of latch circuit 40 is connected to the reset input of counter 41, as well as to the clock input C of shift register 37.

As was described earlier, this circuit operates as a clock construct circuit, whereby a constructed clock pulse appears after a predetermined time reference clock count. The constructed pulse is located at the time within the data pulse train which designates the value of the data digit being read by the shift register.

In operation, with reference to lines 4, 5 and 6 of FIG. 4, the output of the latch 40 is high, until the leading edge of the first data pulse from the aforenoted edge detector arrives. Immediately, the output of the latch 40 becomes low, and this, being applied to the reset input of counter 41, enables it to count. Counter 41 then begins counting clock pulses from time reference clock 10, and upon a count of six, both signals to the inputs of NAND gate 42 are high. This causes the latch to reset to a high level signal, which is the beginning of a constructed clock pulse applied to shift register 37. The data pulse appearing at the data input of shift register 37 is thereby clocked in. In the event it is of high level, it is entered as a "one", the first one being indicated as a start pulse. The constructed clock pulses are shown on line 6 of FIG. 4.

The end of the data pulse then arrives as a trailing edge, causing the latch circuit 40 to output a low level signal. While this removes the constructed clock input from shift register 37, it also resets counter 41, which begins a new count of six. As described earlier, the output of latch 40 will then go to high level, causing whatever data level which appears at the data input of shift register 37 to be shifted. It will be seen from the waveforms, however, that the second constructed clock pulse appears when the data level is low, indicating that the registered digit is a binary zero.

After the leading edge of the next data pulse appears, a count of six in the counter begins again, and the entire process is repeated, for as long as leading and trailing edges of the data signal are entered into latch 40.

It will be realized that there are approximately eight time reference clock 10 pulses during the entire period of a binary digit, including both the low and high levels of the data signal.

Because of the above clock pulse counts, the constructed clock pulses are shifted from the leading edge by six time reference clock pulses, which are two pulses into the interval of the next bit. This means that the first start bit is used only for synchronization and that the second start bit is the first bit being shifted through the shift register.

It should be realized that the shifting of data in the shift register may take place anywhere during the first half of each bit interval, but shifting at a time of two time reference pulses into each bit interval ensures that the received signal does not have to be synchronized with the time reference clock and that the high and low frequency periods being transmitted do not have to be exactly equal.

Having thus far described the means for conversion of the input signal into a data signal, and of clocking it into the shift register, and of checking the cycle count, the means for checking for errors will now be described. This is comprised, as noted with respect to FIG. 3, of a delayed clock generator and of a reset circuit.

Since each binary digit is located at intervals of about eight time reference clock pulses from clock 10, means is provided to compare data as clocked into the shift register with data present at the input of the shift register 37 four time reference clock pulses or half a bit period later. For correct data the two must be of opposite polarity.

Considering first the reset circuit, a counter 43 is provided, connected to clock 10, which provides an output pulse at the count of ten time reference clock pulses. The output signal is applied through an inverter 47 to flip flop 44, which has one output Q connected to the reset input R of shift register 37, and the other $\overline{Q}$, through NOR gate 45, to the reset input R of counter 43. A data signal from output 9 of latch circuit 36 is applied both to the reset input R of flip flop 44 and also to the second input of NOR gate 45 through an inverter 46.

In operation, when a high level data pulse appears, the reset input to counter 43 remains at high level, retaining the counter 43 at fixed reset, which blocks counting. A low level signal is present at output Q4 of counter 43, which signal is inverted in inverter 47, and is applied to flip flop 44. The Q output remains at low level, and output $\overline{Q}$ is retained high. This does not change the output of NOR gate 45, and the entire circuit is at rest.

When the high level data signal drops to low level, the reset input of counter 43 drops, allowing the counter to count clock pulses from time reference clock 10. Under normal conditions, it is only allowed to count to eight (a digit one followed by a digit zero giving rise to an eight receiver clock pulse interval between high level pulses), and is then reset by the beginning of a high level signal. The output from the counter 43 can never reach ten under normal circumstances.

However, at the end of the received data pulse train, a long low level signal is produced. Counter 43 counts to ten, causing flip flop 44 to change state, with output Q going high, and $\overline{Q}$ going low. The high level output from Q is applied to the reset input of shift register 37, clearing it for receipt of the next data pulse train.

The flip flop 44 can also be caused to reset shift register 37 upon receipt of a pulse appearing at the "set" input S of the flip flop.

This reset function is used to determine whether a sequence of high level data pulses is present without low level spacing or vice versa. If the data pulses are not spaced, an error is present, and the shift register 37 is required to be reset, and erasing its present contents.

Connected to the set input of flip flop 44 is NAND gate 48, which has its two inputs connected respectively to a first source of pulses delayed from the start of the constructed clock pulse by four time reference clock pulses from clock 10, and also to the output of an exclusive OR gate 54 having its two inputs respectively connected to the data output 9 of latch circuit 36 and to the first binary output of shift register 37.

Considering now the delayed clock generator circuit which is connected via NAND gate 48 to the set input of flip flop 44, an inverter 49 is connected to the output of NAND gate 42, and applies a narrow set pulse, as shown in line 7 of FIG. 4, to the input of a latch circuit 53. The output of latch circuit 53 is connected to the reset input of a counter 50, which is connected to time reference clock 10, and is adapted to provide an output at each count of four time reference clock pulses. The output signal of counter 50 is inverted in inverter 51, and is applied, with time reference clock pulse, to the respective inputs of NAND gate 52. The output of NAND gate 52 is connected to the second (reset) input of latch circuit 53. The output of inverter 51 is also connected to one of the inputs of NAND gate 48.

Latch circuit 53 sets at the time the constructed clock pulse goes high and enables counter 50 to run until after four time reference pulses it provides a reset signal to latch 53 and thus also resetting counter 50. The input to NAND gate 48 from the delayed clock circuit is thus four time reference clock pulses delayed with respect to the initiation of the reconstructed clock pulse.

Exclusive OR gate 54 has one of its inputs connected to the data output 9 of latch circuit 36, and its second input connected to the first output of shift register 37. Both the data and the just-shifted output signal in the shift register should be opposite, and consequently the output of exclusive OR gate 54 will be continuous low level if this is the case. If they are equal, as may be the case with invalid data, the output of exclusive OR gate 54 will be at high level at the time a delayed clock pulse is generated. This will cause a pulse at the set input of the flip flop 44, and shift register 37 will be reset, which results in rejecting the incoming data.

Under normal conditions, the data must change from a high level to a low level or vice versa between the time the constructed clock pulse and the delayed clock pulse are generated. The flip flop 44 will thus not be caused to change state and shift registers 37 and 37a will not be reset, allowing them to accept input data pulses thereto.

Having thus described the data entry and checking circuit, the output storage and storage control circuits will now be described.

It will be recalled that upon entry of the series of binary bits constituting the first transmitted digit representing function and address and upon registration of the entire series in the aforenoted shift registers, the "one" start bit will be resident at output Q2 of register 37A, and the "function" bit resident at output Q1 of the same register. The function bit, in this embodiment, will be a "zero" for channel designation, and a "one" for other miscellaneous functions. The remaining four bits are obtained at outputs Q1, Q2, Q3 and Q4 of shift register 37.

Output Q2 of register 37A is connected to an input of AND gate 55 as well as to an input of NAND gate 56. Output Q1 of register 37A is connected to a second input of AND gate 56, and also through inverter 57 to a second input of AND gate 55. It may be seen, therefore, that a "one" at the Q2 output of register 37A, and a "zero" (designating channel selection) which will be inverted by inverter 57 will cause, with a third input (to be described later) NAND gate 55 to be activated.

The same output of register 37A will not cause NAND gate 56 to be activated, however. Output Q1 must be a "one" to activate the latter gate (along with a third input which will be described later), but which will not activate gate 55. Consequently the function designation will activate either NAND gate 55, for channel selection, or NAND gate 56, for miscellaneous functions.

The third input to both of gates 55 and 56 are connected together, to the output of NAND gate 58, which has its inputs connected together to operate as an inverter and to the output of NAND gate 59. NAND gate 59 is connected to counter 41, and decodes a pulse after three clock pulses following data having started to be received at output 9 of latch 36. Accordingly we have a source of clock pulses located in time more or less centrally of the individual data bits, for operating gates 55 and 56.

Looking first at the circuit for channel selection, the output of NAND gate 55 is connected to an input of both of NAND gates 60 and 61, and also to the clock input C of flip flop 62. The Q and $\overline{Q}$ outputs of flip flop 62 are respectively connected to a second input of NAND gates 60 and 61. The counter reset input R of a counter 63 is connected to the $\overline{Q}$ output of flip flop 62, and its clock input C is connected to clock 10.

NAND gate 60 is connected to the clock input of storage means 64, while the output of NAND gate 61 is connected to the clock inputs of both of storage means 65 and 66. The binary input terminals of storage means 65 are connected to the binary output terminals of storage means 64, which has its binary input terminals connected to the output terminals of register 37. The binary input terminals of storage means 66 are also connected to the output terminals of shift register 37. The binary output terminals of storage means 65 and 66 provide an output in binary coded decimal of the most significant digit and least significant digit respectively.

In operation, flip flop 62 is reset by the pulse from NAND gate 55 when the second digit is received or by counter 63, depending on which causes a reset to come first. This will be described below. A low level output signal appears at the Q output of flip flop 62, and a high level output at $\overline{Q}$. This is inverted in gates 60 and 61, causing access to storage means 64 to be enabled and access to storage means 65 and 66 to be disabled.

When the proper "one" and "zero", start and channel selection digits appear at outputs Q2 and Q1 of shift register 37A, NAND gate 55 is activated, causing a low level pulse to appear at the first inputs of gates 60 and 61, providing initially a low level signal at Q and a high level signal at $\overline{Q}$, which are inverted, causing a clock pulse to appear at the clock input of storage means 64, and deleting the clock pulse from storage means 65 and 66.

On the return to a positive level of the pulse from NAND gate 55, flip flop 62 changes its state making a high level at Q and a low level at $\overline{Q}$.

With storage means 64 activated, the digits stored in the shift register 37 and 37A are received and stored by the storage means 64.

In the meantime, the low level output now appearing at $\overline{Q}$ of flip flop 62, which is connected to the reset input of counter 63, removes the reset to that counter, causing it to begin counting time reference clock pulses. In the event it reaches a predesignated count or time (for instance 1.6 seconds) its output which is connected to the reset input of flip flop 62 resets flip flop 62, which prepares the storage means 64 for a new first digit. Thus an undue time delay between transmission of the two digits of, say, 1.6 seconds will cause the first digit received to be disregarded. In this manner operation of the transmmitter by accident which is not intended to designate a particular channel or function is ignored by the receiver, as two digits must be transmitted within the predesignated length of time.

After reception of the first digit, the shift registers 37 and 37A are reset by the reset pulse applied from flip flop 44, as described, earlier. Within the counting period of counter 63, the data comprising the second digit is fed into shift registers 37 and 37A. Of course, since it is a channel selection digit, similar to the preceding one, a second pulse will be fed through NAND gate 55, in the same manner as described earlier. This will now enable access to storage means 65 and 66 providing the second digit was entered prior to the resetting of flip flop 62 by counter 63. Each of these storage means thus receives the data applied to it: storage means 65, that data which is stored in storage means 64, and storage means 65, that data which is present at the output of shift register 37. As a result, the first digit is stored in storage means 65, and the second digit is stored in storage means 66. Preferably the output of storage means 65 is provided as a tens indicator in binary coded decimal, and the output of storage means 66, a units indicator in binary coded decimal. Accordingly up to 100 channels, or their equivalent, can be designated, or 256 if hexadecimal entries are used.

The circuit for varying the volume, brightness, tint, or other functions will now be described, with control of the volume control circuit 72A as an example.

A priority encoder 67 is provided, the output of which is connected to multiplexer 68 at inputs A, B and C. When activated, the priority encoder causes the multiplexer to provide a voltage output signal at its terminal 69 based on a statistical evaluation of the input signal.

Connected to the input of priority encoder 67 is a binary counter 70, which is clocked from a 40 kiloHertz oscillator or clock 71.

Multiplexer 68 has a six port input X2-X7, which ports are connected to the output of six stage up-down counter 72. The multiplexer 68 is caused by the priority encoder to be responsive to the binary input at the first input port X2 50% of the time, to input port X3 25% of the time, input port X4 12 ½% of the time, input port X5 6 ¼% of the time, input port X6 3 ⅛% of the time, and input X7 1 9/16% of the time. The resulting value is presented to the RC integrator comprising series resistor 73 and capacitor to ground 74, which establishes a D.C. voltage level. The voltage held on capacitor 74 is applied to TV set circuitry to control the voltage in a D.C. controlled volume control circuit.

The above-described circuitry is reproduced in brightness control circuit 75 and tint control circuit 76. Of course, the D.C. output voltages could be used to control other functions.

The individual control circuits 72A, 75 and 76 are activated by individual address leads from decoder 77, which is enabled by a pulse appearing from NAND gate 56, which has its output connected to the enable input E of decoder 77. The address inputs A and B to decoder 77 are connected to outputs Q2 and Q3 of shift register 37, which are sufficient to specify one of four outputs: tint enable, volume enable, mute/normal enable, and brightness enable. The volume enable output of register 77 is connected to the clock input of six-stage up-down counter 72; the tint enable is connected to the clock input of control circuit 76, and the brightness enable is connected to the clock input of brightness control circuit 75.

Output Q4 of shift register 37 is connected to the up-down input of the respective up-down counters in control circuit 72, 75 and 76.

In the event three outputs Q1, Q2 and Q3 of shift register 37 are used, a total of eight different miscellaneous functions can be controlled, with appropriate circuitry.

In operation, once the data representing a digit is resident in shift register 37 and 37a, and a "miscellaneous function" "one" bit is present, NAND gate 56 will be activated, and will provide an enable pulse (derived from AND gate 58) to the enable input of decoder 77. The binary bits from the outputs Q2 and Q3 of register 37 will be applied to inputs A and B of decoder 77, and, select one of the outputs of the decoder for the duration of the pulse from gate 58. A pulse at output 1 of register 77, designating a volume change, will be applied to the clock input of the six-stage up-down counter of control circuit 72A. A bit from output Q4 of register 37 designates whether the clock pulse is to be interpreted to vary the volume up or down for each pulse at the clock input to counter 72.

Counter 72 will begin counting with the first clock pulse, and multiplexer 68 will vary its output voltage by the degree of a single pulse.

Continuous reception of a data signal containing a miscellaneous function bit, with the same bits designating volume change will cause repetitive enabling of decoder 77, and repetitive inputting of pulses to counter 72. This causes an outputting of continuous increase or decrease in the number of pulses at the output of multiplexer 68, with a corresponding change in D.C. voltage across output capacitor 74.

A change in the binary bit at Q4 output of shift register 37 changes the instruction to the up-down counter 72, causing repetitive counting in the opposite direction. This results in a variation of voltage at the output 69 of multiplexer 68, causing variation of the TV set volume in the opposite direction. Accordingly, the volume can be varied louder or softer.

Control circuits 75 and 76 are varied in a similar manner, after activation by a signal at the proper output terminals of decoder 77 determined by the address at terminals Q2 and Q3 of shift register 37. In this manner a D.C. variation voltage for brightness and tint are produced, which allows variation of the brightness and tint on either side of its preceding status.

Means is also provided for muting the volume. With an output signal at the mute/normalize output port 2 of decoder 77, and with a low level signal at the Q4 output of shift register 37, a preset enable signal is applied to the up-down counter. This causes the up-down counter 72 to attain an all "zero's" state since all jam inputs J1–J4 are in this case "zero", causing the multiplexer output to go to zero level, and consequently muting the volume.

If the output of decoder 77 is high, and output Q4 is at a high level the jam input of the sixth stage of up-down counter 72 is high which causes a preset to the mid position.

A similar function can be obtained with the brightness and tint, with the presence of a "one" bit at the Q4 output of shift register 37. The bit enters input A of decoder 78, with an output at the mute/normal port of decoder 77, to cause an output signal from decoder 78. This output signal is connected to the preset enable inputs of control circuits 75 and 76 in parallel. As with respect to volume, the brightness and tint voltage levels are caused to go to predetermined levels. Factory set, or user set levels can in this way be remotely obtained.

A predetermined level is set by a jam input in the up-down counters, activated at the preset input PE terminals. When a high level signal appears at output Q4 of register 37, as described earlier decoder 78 is caused to operate, causing the up-down counters of control circuits 75 and 76 to jam to a preset fixed value.

With release of the mute/normalize signal from output 2 of decoder 77, as well as the signal at output Q4 of shift register 37, all the circuits can be readjusted to any desired level, from the preset levels.

It is preferred to use a six-stage up-down counter in the control circuits 72A, 75, and 76 as 64 D.C. levels can be designated for control of the TV set analog circuits.

The receiver described above can be conveniently fabricated of integrated circuits. The latch circuits and Schmitt triggers are well known, and can be fabricated of the types of gates as shown in the schematic drawing. Gates used in this circuit are standard and readily available from a variety of manufacturers. The remaining integrated circuits are available from Radio Corporation of America or Motorola, Inc., as follows:

| Function | Type No. |
| --- | --- |
| Counter 32 | 4024 |
| Counters 34, 41, 50 and 43 | 4518 |
| Inverters | 4069 |
| Shift Register 37 | 4015 |
| Storage Means 64, 65 and 66 | 4042 |
| Counter 63 | 4010 |
| Flip Flop 44, 62 | 4013 |

-continued

| Function | Type No. |
| --- | --- |
| Decoders 77, 78 | 4555 |
| Up-Down Counter | 4029 |
| Multiplexer 68 | 14512 |

Variations and modifications of the specific receiver embodiment described may now become evident, within the scope of the invention. The arrangement of the bits and the total number of bits in the transmitted signal can be varied, and the circuit varied to suit. The control of the volume, brightness and tint can be deleted from the circuit, and the receiver applied to a TV set only to select a particular channel or additional circuits can be added. In the latter form, it can be used to control the varactor in a tuner. A channel address or miscellaneous function command can be utilized to activate an on-off circuit and turn the TV set on or off.

In addition, an automatic fine tuning disable signal e.g. a 1.6 second pulse may be derived from counter 63 to permit automatic AFT control. A VHF/UHF signal may be decoded to permit band switching functions in the tuner. The two digits may be transmitted in a single data stream instead of transmitting each digit separately. Also the system may be used for transmission of single entries (i.e. one key per channel) or multiple digits may be used e.g. the selection of a telephone number when the circuit is varied to suit.

The transmission of both true and complement signals may be deleted if the clock pulses are constructed by different means. The present circuit can also be used to receive error check and operate signals transmitted by wire, by infrared waves, by light, etc. Pulse signals can also be received without the use of a carrier wave using the appropriate transmission medium, merely by modifying the signal reception circuitry which determines the frequency of the received signal, and by entering the received pulses as the data signal.

The parallel output of register 37 can also be applied to a display circuit whereby the address, such as a selected channel, can be displayed as by a light emitting diode readout, either constantly or for a time period following channel or function change.

The entire remote control receiver described above can be built in to a television set.

The embodiments of the invention in which an exclusive property or privilege is claimed are defined as follows:

1. An ultrasonic remote control system comprising:
    (a) means for receiving a pulse modulated continuous wave ultrasonic signal at a first predetermined frequency, each pulse being immediately followed by a continuous wave ultrasonic signal at a second predetermined frequency which has amplitude such as to mask echoes of the first predetermined frequency at the receiving means, the pulses being representative of transmitted data,
    (b) means to determine whether the received signal is above or below the frequency of a reference frequency,
    (c) means for recognizing a change in input frequency with respect to the reference frequency,
    (d) means for counting said changes, determining the values of the data represented and providing a parallel coded representative of said value,
    (e) in which said pulses comprise the data signal, (f) counting means for determining the data represented by the pulses of the data signal and for providing a coded address signal representative of the values of the data represented by said pulses, (g) means for generating clock pulses upon the reception of the data signal and for applying the clock pulses to the counting means for operating the counting means at particular times, and (h) means for enabling the counting means upon the reception of data.

2. An ultrasonic remote control system as defined in claim 1, in which the enabling means includes means for checking the inter-data-pulse interval and for resetting the counting means in the event a length of said interval is incorrect whereby any data resident in the counting means is discarded.

3. An ultrasonic remote control system as defined in claim 1, further including means for checking the conditions that a low frequency interval is followed by a high frequency interval at predetermined times, and a high frequency interval is followed by a low frequency interval at other predetermined times; the enabling means further including means for resetting the counting means in the event one of the conditions is not met.

4. An ultrasonic remote control system as defined in claim 3, further including means for checking the inter-data-pulse interval and for resetting the counting means in the event a length of said interval is incorrect whereby any data resident in the counting means is discarded.

5. An ultrasonic remote control system as defined in claim 4 in which the means for generating clock pulses provides constructed clock pulses in synchronism with each received data pulse.

6. An ultrasonic remote control system as defined in claim 1 in which the means for generating clock pulses provides constructed clock pulses in synchronism with each received data pulse.

7. An ultrasonic remote control system as defined in claim 1, the counting means having a reset input connected to the enabling means, a clock input connected to the means for constructing said clock pulses, a data input connected to the (b) means, and an address output for providing said address signal.

8. An ultrasonic remote control system as defined in claim 7, means for squaring each cycle of the ultrasonic received signal, a frequency comparator connected to the squaring means for counting the individual squared ultrasonic signal pulses, and for providing an interval pulse after a predetermined number of counts which occur within a predetermined time interval, a reset input in the frequency comparator and a time reference clock pulse supply of frequency being a predetermined integral divisor of a frequency between the two received frequencies connected to the reset input of the frequency comparator, said predetermined time interval being the period between pulses from the time reference clock pulse supply, further including means for providing an output data pulse to the data input of the counting means following the generating of interval pulses for a period extending to the next time reference clock pulse.

9. An ultrasonic remote control system as defined in claim 8, in which the means for constructing the clock pulses is comprised of means for detecting the leading and trailing edges of said data pulses, and means for initiating the beginning of each said constructed clock pulse a predetermined period after each said trailing or leading edge, and for terminating said constructed clock pulse prior to or at the time of the appearance of an immediately following one of said leading or trailing edges, said predetermined period being greater than the period of an individual one of said data pulses.

10. A remote control system, including means for receiving a signal representing at least one digit, each digit being represented by a series of binary bits, each bit being represented by a series of two frequencies, a "0" being represented by a first predetermined frequency immediately followed by a second predetermined frequency and a "1" being represented by the second frequency immediately followed by the first; means for converting the bits of the signal into data pulses, register means for registering the data pulses, means for checking the data pulses for period and spacing and for resetting the register means in the case of error in said period and spacing, means for clocking the register means at a time derived from the data pulses for proper registration of the data pulses, and storage means connected to the output of the register means for storing an output signal represented by said digit.

11. A remote control system as defined in claim 10, further including means for sensing a predetermined bit sequence represented in the register, and upon sensing of said sequence, for enabling and causing application of said output signal to a miscellaneous function D.C. voltage control circuit, for control of an external function.

12. An ultrasonic remote control system as defined in claim 10, each of the numbers being made up of a series of binary bits comprising at least a start bit, and a series of at least four bits representing one digit or a function designation, further including means connected to said shift register for sensing the digit or function designation, and for providing a miscellaneous function enable pulse at a miscellaneous function output in the event the bits identify a miscellaneous function, whereby a miscellaneous function circuit is enabled.

13. An ultrasonic remote control sytem as defined in claim 12, including voltage control means enabled by the miscellaneous function enable pulse for providing a D.C. voltage for control of an analog D.C. voltage-controlled output function, which is adapted to set the output function to a controlled level.

14. An ultrasonic remote control system as defined in claim 13, including an individual addressed D.C. voltage control means for providing a control voltage to the volume, control circuit of a television set.

15. An ultrasonic remote control system for a television receiver, including means for receiving a series of two sequences of said ultrasonic signal representing a series of two binary coded numbers, comprising:

(a) means for receiving a pulse modulated continuous wave ultrasonic signal at a first predetermined frequency, each pulse being immediately followed by a continuous wave ultrasonic signal at a second predetermined frequency which has amplitude such as to mask echoes of the first predetermined frequency at the receiving means, the pulses being representative of transmitted data, (b) means to determine whether the received signal is above or below the frquency of a reference frequency, (c) means for recognizing a change in input frequency with respect to the reference frequency, (d) means for counting said changes, determining the values of the data represented, and providing a parallel coded signal representative of said value including a counter or shift register, (e) further including means connected to the output of said counter or shift register for distinguishing between the first and second number, and for causing storage of the address represented by the first number in a first storage means and of the address represented by the second number in a second storage means, said numbers identifying a television channel to be selected.

16. An ultrasonic remote control system as defined in claim 15, including means for timing the interval following registration of the address corresponding to the first number, and in the event said latter interval exceeds a predetermined period, for resetting and causing storage in the first storage means of any following address as an address represented by a first number instead of as a following (second) number.

17. An ultrasonic remote control system as defined in claim 16, including means for converting the received signal into data pulses comprising said sequences, means for checking the data pulses for period and spacing and for resetting the counter or shift register in the case of error in said period and spacing, means for clocking the register means at a time derived from the data pulses for proper registration of the data pulses.

18. An ultrasonic control system as defined in claim 15 in which each number is comprised of at least a start bit, and a series of at least four bits representing one digit or a function designation, further including means connected to said shift register for sensing the digit or function designation, and for providing a miscellaneous function enable pulse at a miscellaneous function output in the event the bits identify a miscellaneous function, whereby a miscellaneous function circuit is enabled.

19. A remote control system as defined in claim 15, including means for converting the received signal into data pulses comprising said sequences, means for checking the data pulses for period and spacing and for resetting the shift register in the case of error in said period and spacing, means for clocking the register means at a time derived from the data pulses for proper registration of the data pulses, means for sensing a predetermined bit sequence represented in the register, and upon sensing of said sequence for enabling and causing application of said output signal to a miscellaneous function D.C. voltage control circuit, for control of an external function.

20. A remote control system comprising:
(a) means for receiving a pulse modulated continuous wave signal at a first predetermined frequency, each pulse being immediately followed by a continuous wave signal at a second predetermined frequency which has amplitude such as to mask echoes of the first predetermined frequency at the receiving means, the pulses being representative of transmitted data and comprise the data signal,
(b) means to determine whether the received signal is above or below the frequency of a reference frequency,
(c) means for recognizing a change in input frequency with respect to the reference frequency, and
(d) counting means for determining the data represented by the pulses of data signal and for providing a coded address signal representative of the values of the data represented by said pulses, means for generating clock pulses from the data signal and for applying the clock pulses to the counting means for operating the counting means at particular times, and means for enabling the counting means upon the reception of data.

21. A remote control system as defined in claim 20, further including means for checking the conditions that a low frequency interval is followed by a high frequency interval at predetermined times and that a high frequency interval is followed by a low frequency interval at other predetermined times; the enabling means further including means for resetting the counting means in the event one of said conditions is not met, and means for checking the inter-data-pulse interval and for resetting the counting means in the event a length of said interval is incorrect whereby any data resident in the counting means is discarded.

22. An ultrasonic remote control system as defined in claim 21, further comprising means for enabling the counting means for the period of each data pulse and a predetermined period, and for resetting the counting means in the event a following data pulse does not follow its preceding data pulse by less than said predetermined period.

23. A remote control system as defined in claim 20, the counting means having a reset input connected to the enabling means, a clock input connected to the means for constructing said clock pulses, a data input connected to the (b) means, and an address output for providing said address signal, further including means for squaring each cycle of the ultrasonic received signal, a frequency comparator connected to the squaring means for counting the individual squared ultrasonic signal pulses, and for providing an interval pulse after a predetermined number of counts which occur within a predetermined time interval, a reset input in the frequency comparator, and a time reference clock pulse supply of frequency being a predetermined integral divisor of a fequency between the two received frequencies connected to the reset input of the frequency comparator, said predetermined time interval being the period between pulses from the time reference clock pulse supply, further including means for providing an output data pulse to the data input of the counting means following the generation of interval pulses for a period extending to the next time reference clock pulse.

24. A remote control system comprising:
(a) means for receiving a sequence of pulses representative of transmitted data,
(b) counting means for counting the pulses and providing a parallel coded address signal representative of the values of the data represented by said pulses, means for generating clock pulses from the data signal and for applying the clock pulses to the counting means for operating the counting means at particular times, and means for enabling the counting means upon the reception of data.

25. An ultrasonic control system as defined in claim 17 in which each number is comprised of at least a start bit, and a series of at least four bits representing one digit or a function designation, further including means connected to said shift register for sensing the digit or function designation, and for providing a miscellaneous function enable pulse at a miscellaneous function output in the event the bits identify a miscellaneous function, whereby a miscellaneous function circuit is enabled.

* * * * *